(12) United States Patent
Chiang

(10) Patent No.: US 6,866,520 B2
(45) Date of Patent: Mar. 15, 2005

(54) CONDUCTIVE TERMINAL AND ELECTRICAL CONNECTOR APPLYING THE CONDUCTIVE TERMINAL

(75) Inventor: Chun-Hsiang Chiang, Taipei Hsien (TW)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/858,134

(22) Filed: Jun. 1, 2004

(65) Prior Publication Data

US 2004/0259393 A1 Dec. 23, 2004

(30) Foreign Application Priority Data

Jun. 5, 2003 (TW) ..................... 92210301 U

(51) Int. Cl.⁷ .............................. H01R 12/00
(52) U.S. Cl. .................... 439/66; 439/862
(58) Field of Search .................. 439/66, 68, 71, 439/74, 591, 862, 525, 342

(56) References Cited

U.S. PATENT DOCUMENTS

| | | | | |
|---|---|---|---|---|
| 3,696,323 A | * | 10/1972 | Kinkaid et al. | ............. 439/525 |
| 3,865,458 A | * | 2/1975 | Pauza et al. | ................ 439/345 |
| 5,213,513 A | * | 5/1993 | Brown et al. | ................. 439/68 |
| 5,980,268 A | * | 11/1999 | Mischenko et al. | ........... 439/66 |
| 6,149,443 A | * | 11/2000 | Moran | ......................... 439/66 |
| 6,293,806 B1 | * | 9/2001 | Yu | ............................... 439/66 |
| 6,551,149 B2 | * | 4/2003 | Orihara | ..................... 439/862 |
| 6,695,628 B2 | * | 2/2004 | Yeh | ............................. 439/83 |

* cited by examiner

*Primary Examiner*—Tho D. Ta
(74) *Attorney, Agent, or Firm*—Robert J. Zeitler

(57) ABSTRACT

A conductive terminal is positioned in an insulative housing to constitute an electrical connector. The insulative housing is formed with a first face and a second face opposite to each other, and has a plurality of terminal receiving cavities extending through the first face and the second face. The conductive terminal includes a base for abutting against the corresponding terminal receiving cavity. The base has two adjacent sidewalls forming an angle therebetween. A resilient arm extends from one edge of one of the sidewalls in a direction of extension of the terminal receiving cavity. The resilient arm is bent back to approach the opposite other edge of the corresponding sidewall and forms a non-closed ring-shape with the corresponding sidewall. Two opposite ends of the resilient arm which are farthest away from the corresponding sidewall are respectively formed with a first contact portion and a second contact portion. The first contact portion and the second contact portion contact electrically and respectively an electronic component and a circuit board to enable signal transmission between the electronic component and the circuit board through the conductive terminal.

18 Claims, 4 Drawing Sheets

CONDUCTIVE TERMINAL AND ELECTRICAL CONNECTOR APPLYING THE CONDUCTIVE TERMINAL

FIELD OF THE INVENTION

This invention relates to a conductive terminal and an electrical connector using such conductive terminals, and, more particularly, to a conductive terminal applied to an LGA (land grid array) electrical connector.

BACKGROUND OF THE INVENTION

Referring to FIG. 1, U.S. Pat. No. 5,653,598 discloses an LGA (land grid array) electrical connector and a conductive terminal employed thereby, in which a tightening member (not shown) is generally used to clamp the electrical connector between a packaged integrated circuit (IC) 8 and a circuit board 9 so as to establish electrical connection without the need for a soldering step.

A bottom side of the integrated circuit 8 is formed with conductive contact pads 81 that are arranged in an array, and the circuit board 9 also has conductive contact pads 91 provided thereon at positions corresponding to the contact pads 81 of the integrated circuit 8. The integrated circuit 8 and the circuit board 9 are respectively located on two opposite upper and lower sides of the electrical connector. In addition, a plurality of terminal receiving cavities 61 are provided in an insulative housing 6 of the electrical connector and are arranged in an array form.

Each terminal receiving cavity 61 is disposed to receive a conductive terminal 7. The conductive terminal 7 includes two spaced-apart resilient arms 71, 72 and a bent portion 73 connected to one end of each of the resilient arms 71, 72 and having a measure of resiliency. Each of the resilient arms 71, 72 has a free end. A nose 711, 721 is formed at the free end to contact the contact pad 81, 91 of the integrated circuit 8 or the circuit board 9. A support arm 712, 722 extends from one nose 711 or 721 toward the other nose 721 or 711. When the integrated circuit 8 and the circuit board 9 are forced to approach the electrical connector, the conductive terminal 7 will be pressed so that the two resilient arms 71, 72 displace toward each other such that the support arms 712, 722 contact each other, thereby establishing a signal transmission path.

However, there are drawbacks with the aforesaid electrical connector. For instance, when the bent portion 73 of the conductive terminal 7 deforms, lateral deformation may also occur at the same time such that the two support arms 712, 722 move toward each other without contacting. Even though the wall surface of the terminal receiving cavity 61 can limit lateral displacement of the support arms 712, 722, the support arms 712, 722 may just scrape the wall surface of the terminal receiving cavity 61, without coming into contact with each other. Therefore, the aforesaid structure is quite unsatisfactory in terms of signal transmission stability.

Hence, the inventor has proposed another solution with respect to such an LGA electrical connector construction.

SUMMARY OF THE INVENTION

Therefore, an object of this invention is to provide a conductive terminal applied to an LGA and having preferred electrical connection stability, and an electrical connector structure.

Accordingly, the conductive terminal of this invention is positioned in an insulative housing to constitute an electrical connector. The insulative housing is formed with a first face and a second face opposite to each other, and has a plurality of terminal receiving cavities extending through the first face and the second face.

The conductive terminal includes a base for abutting against the corresponding terminal receiving cavity to achieve positioning. The base has two adjacent sidewalls forming an angle therebetween. A resilient arm extends from one edge of one of the sidewalls in a direction of extension of the terminal receiving cavity. The resilient arm is bent back to approach the opposite other edge of the sidewall to form a non-closed ring shape such that the resilient arm is formed with a first contact portion and a second contact portion that are capable of resilient restoration at two opposite ends thereof, respectively, which are farthest away from the sidewall with the sidewall as the center.

By means of the first contact portion and the second contact portion which respectively project outwardly of the planes in which the first face and the second face of the insulative housing lie to contact electrically and respectively an electronic component and a circuit board, signal transmission between the electronic component and the circuit board can be conducted through the conductive terminal.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENTS

Figure 1:
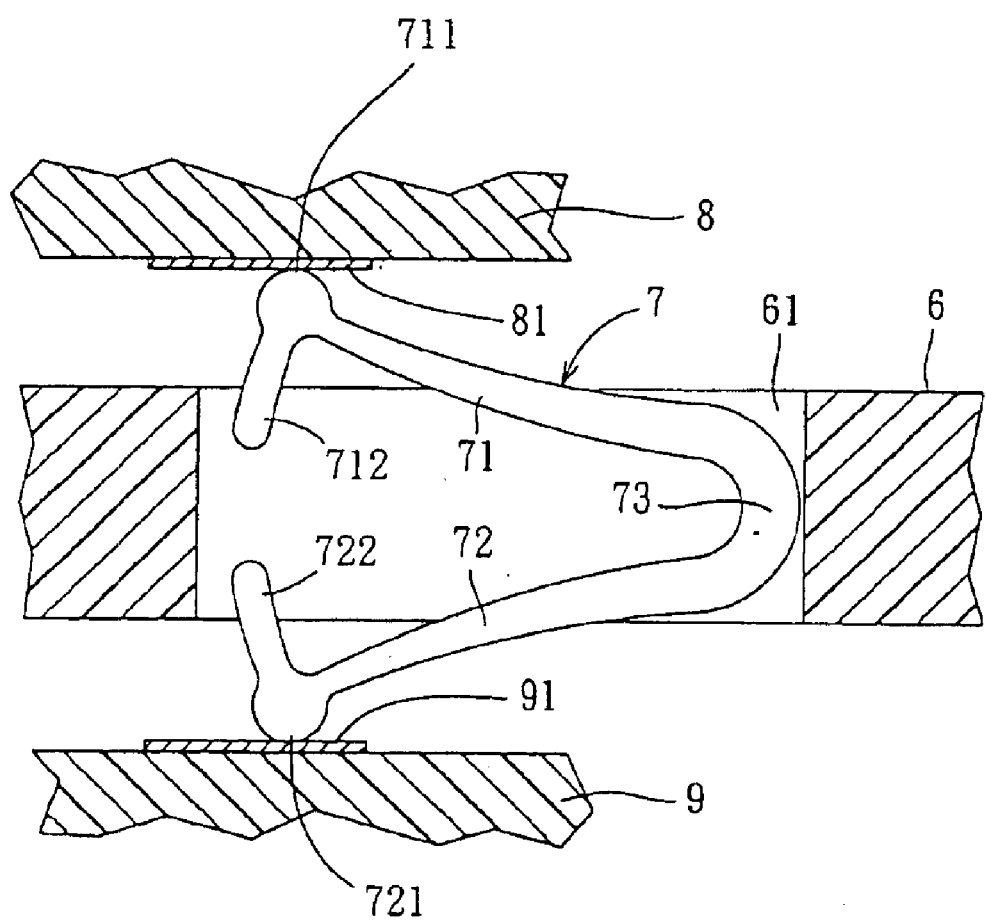
FIG. 1 is a schematic view to illustrate the structure of a conventional conductive terminal applied to an LGA electrical connector.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 2:
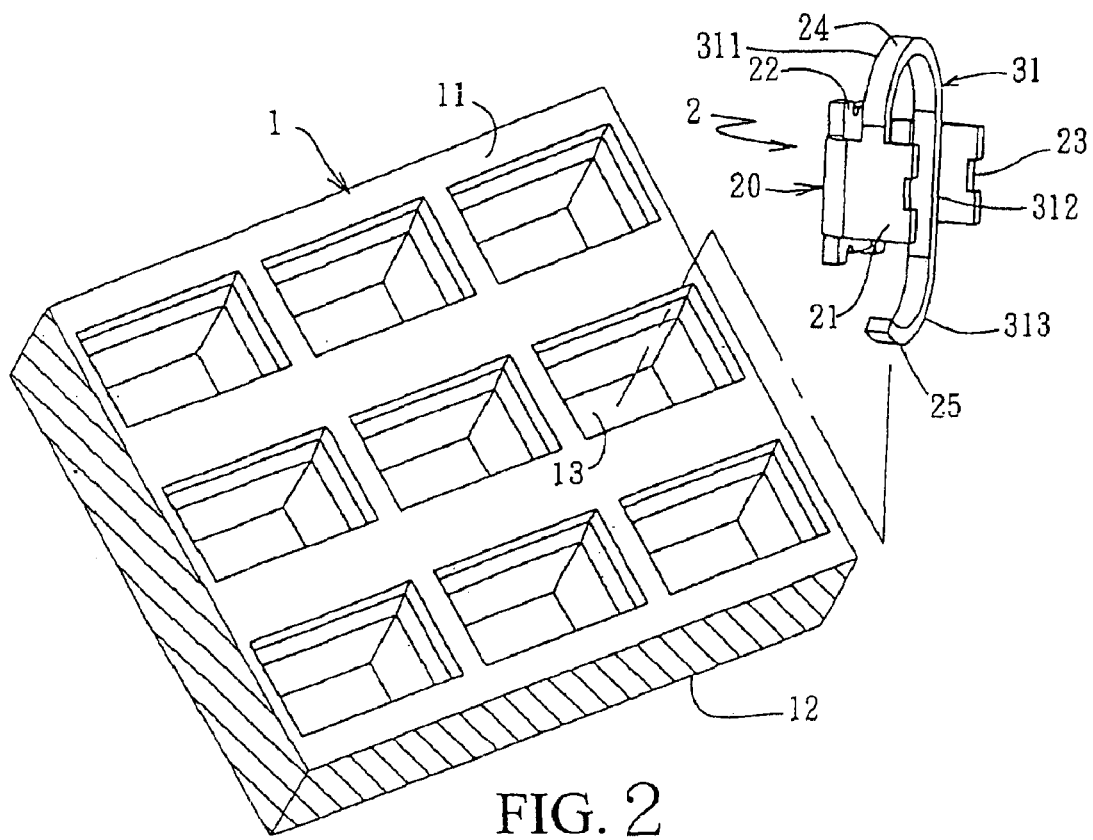
FIG. 2 is a perspective view of the structure of the first preferred embodiment of a conductive terminal according to this invention, illustrating schematically a configuration of an electrical connector formed by an assembly of the conductive terminal and an insulative housing.
Figure 3:
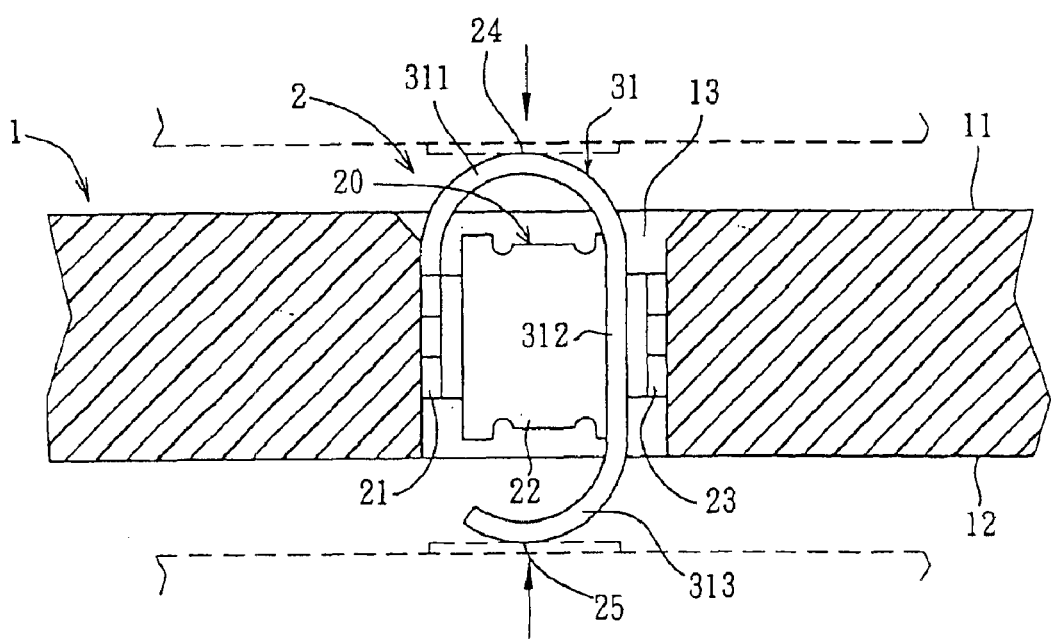
FIG. 3 is a schematic sectional side view of FIG. 2, illustrating the relative position relationship of the conductive terminal in the insulative housing.

Referring to FIGS. 2 and 3, similar to the aforesaid conventional structure, the first preferred embodiment of a conductive terminal and an electrical connector applying the conductive terminal according to this invention is used to connect an electronic component of an integrated circuit of a central processing unit (CPU) with a circuit board. A bottom side of the electronic component 4 has a plurality of contact pads 41 arranged thereon in an array, whereas a surface of the circuit board 5 is provided with a plurality of conductive contact pads 51 at positions corresponding to the contact pads. The electrical connector includes an insulative housing 1 and a plurality of conductive terminals 2.

The insulative housing 1 is formed with a first face 11 disposed at an upper side to be proximate to the electronic component 4, and a second face 12 disposed at a lower side to be proximate to the circuit board, and has a plurality of terminal receiving cavities 13 extending through the first face 11 and the second face 12. The position of each of the terminal receiving cavities 13 corresponds to the contact pads of the electronic component and the circuit board, and the shape of the space in each of the terminal receiving cavities 13 is defined by an inner wall surface 13a. In this embodiment, the terminal receiving cavity 13 is formed as a rectangular cavity.

Each of the conductive terminals 2 includes a base 20, and a first contact portion 24 and a second contact portion 25 which extend from the base 20 and which are capable of resilient restoration. In this embodiment, the base 20 is punched and bent from a metal plate into a U-shape, which is formed with a first sidewall 21, a second side wall 22, and a third sidewall 23 that are adjacent and substantially perpendicular relative to one another. The first sidewall 21 and the third sidewall 23 are opposite to each other in a spaced-apart relationship. In actual assembly, the first sidewall 21 and the third sidewall 23 can be slightly stretched outward relative to the second sidewall 22. After the base 20 is inserted into the corresponding terminal receiving cavity 13, the first sidewall 21 and the third sidewall 23 are pressed against the inner wall surface defining the terminal receiving cavity 13 such that a resilient restoring force is generated at the first sidewall 21 and the third sidewall 23 to enable the base 20 to engage with the inner wall surface, thereby positioning each conductive terminal 2 in the corresponding terminal receiving cavity 13. Further, a resilient arm 31 extends from the first sidewall 21. The resilient arm 31 has a first curved section 311 projecting from an edge of the first sidewall 21 which is disposed in a direction of extension of the terminal receiving cavity 13 proximate to the first face 11 of the insulative housing 1 to be disposed outwardly of the first face 11 and bent in the direction of the third sidewall 23, a connecting section 312 connected to the other end of the curved section 311 and passing between the first sidewall 21 and the third sidewall 23 (i.e., through the terminal receiving cavity 13) to extend in the direction of the second face 12 of the insulative housing 1, and a second curved section 313 that is connected to the other end of the connecting section 312, that projects outwardly of the second face 12, and that is bent towards the first sidewall 21 such that the resilient arm 31 and the first sidewall 21 of the base 20 cooperatively define a non-closed ring shape, with the first contact portion 23 located on the first curved section 311 of the resilient arm 31 which is farthest away from the base 20, and with the second contact portion 25 located on the second curved section 313 at the other opposite end which is farthest away from the base 20.

When the electrical connector is interposed between the electronic component and the circuit board so that they are proximate to each other, by virtue of the electrical contact between the first contact portion 24 of the conductive terminal 2 and the contact pad 41 of the electronic component 4, and the electrical contact between the second contact portion 25 and the contact pad 51 of the circuit board 5, the resilient arm 31 may be compressed to produce a resilient restoration force so as to enhance the electrical contact characteristics of the first contact portion 24 and the second contact portion 25.

Figure 4:
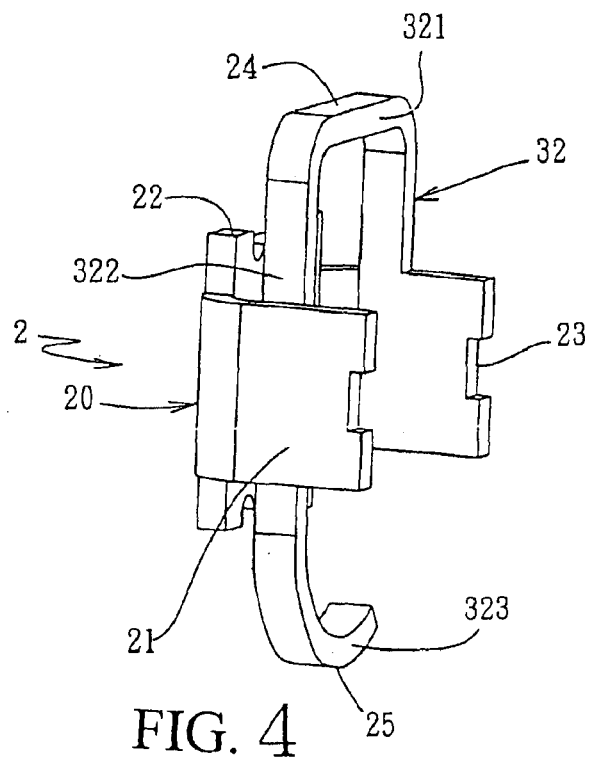
FIG. 4 is a perspective view of the structure of the second preferred embodiment of a conductive terminal according to this invention.
Figure 5:
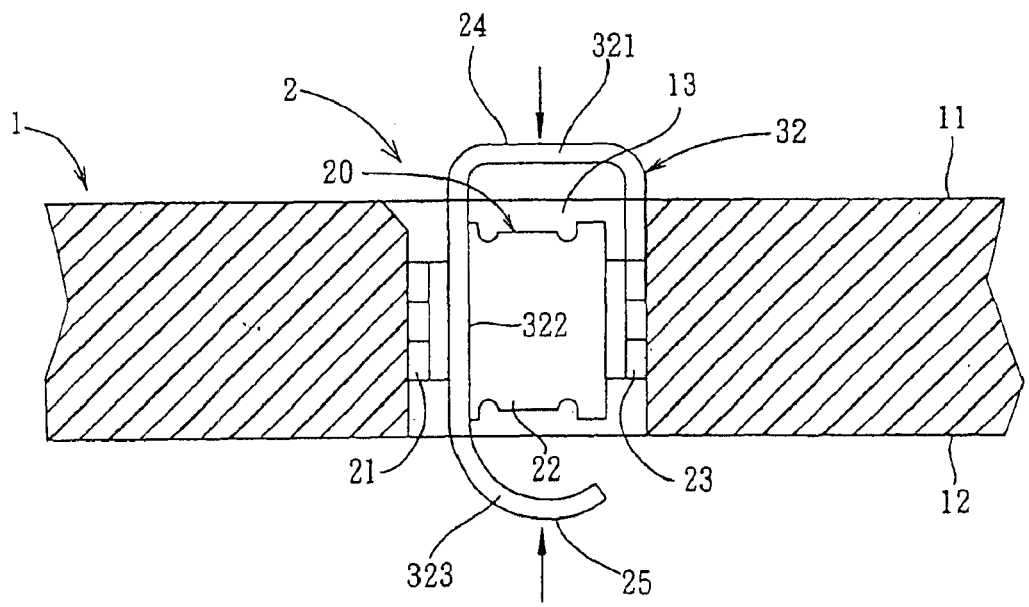
FIG. 5 is a schematic sectional side view of FIG. 4, illustrating the relative position relationship of the conductive terminal in an insulative housing.

Referring to FIGS. 4 and 5, the second preferred embodiment of this invention differs from the embodiment of FIG. 2 in that the resilient arm 32 of the conductive terminal 2 extends from the third sidewall 23 such that the resilient arm 32 has a bent section 321 that projects from the edge of the third sidewall 23 proximate to the first face 11 of the insulative housing 1 and outwardly of the first face 11 and that is bent in the direction of the first sidewall 21 in a substantially inverted U-shape, a connecting section 322 connected to the other end of the curved section 321 and passing between the first sidewall 21 and the third sidewall 23 to extend in the direction of the second face 12 of the insulative housing 1, and a curved section 323 that is connected to the other end of the connecting section 322, that projects outwardly of the second face 12, and that curves in the direction of the third sidewall 23 such that the resilient arm 32 also cooperates with the third sidewall 23 of the base 20 to form a non-closed ring shape, with the first contact portion 24 located on the bent section 321, the first contact section 24 being generally planar, and with the second contact portion 25 located on the curved section 323.

Figure 6:
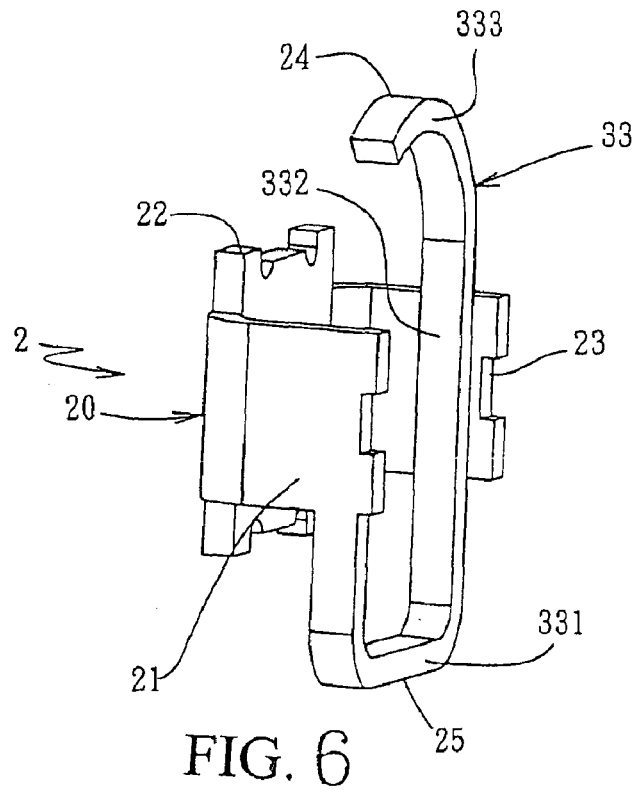
FIG. 6 is a perspective view of the structure of the third preferred embodiment of a conductive terminal according to this invention.
Figure 7:
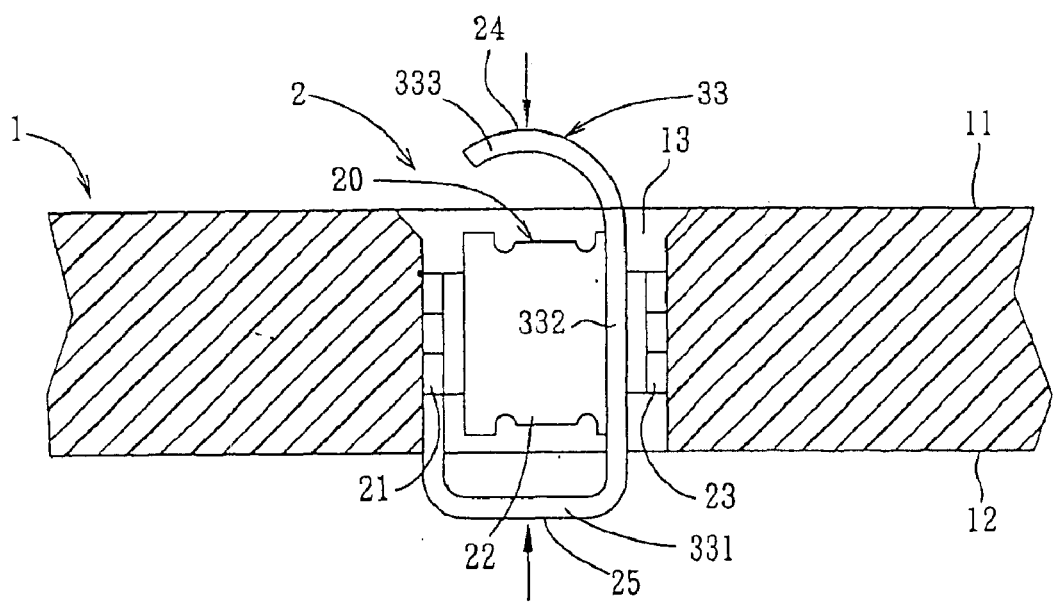
FIG. 7 is a schematic sectional side view of FIG. 6, illustrating the relative position relationship of the conductive terminal in an insulative housing.

Further, reference is made to FIGS. 6 and 7, which show the third preferred embodiment of this invention. The resilient arm 33 of the conductive terminal 2 extends from the first sidewall 21 such that the resilient arm 33 has a bent section 331 that projects from the edge of the first sidewall 21 proximate to the second face 12 of the insulative housing 1 and outwardly of the second face 12 and that is bent in the direction of the third sidewall 23 in a substantially U-shape, a connecting section 332 connected to the other end of the bent section 331 and passing between the first sidewall 21 and the third sidewall 23 to extend in the direction of the first face 11 of the insulative housing 1, and a curved section 333 that is connected to the other end of the connecting section 332, that projects outwardly of the first face 11, and that curves in the direction of the first sidewall 21, thereby resulting in cooperation of the resilient arm 33 and the first sidewall 21 of the base 20 to form a non-closed ring shape as in the aforesaid embodiments, with the first contact portion 24 located on the curved section 333, and with the second contact portion 25 located on the bent section 331, the second contact portion being generally planar. As the function thereof is similar to the aforesaid embodiments, it will not be repeated herein.

However, what are described hereinabove are merely preferred embodiments of this invention, in which although the base of the conductive terminal is illustrated as having a U-shape, the use of two substantially L-shaped sidewalls that are adjacent to each other at 90 degrees to enable the first resilient arm and the second resilient arm to extend from the edge of one of the sidewalls may also achieve the aforesaid object. Therefore, the embodiments should not be based upon to limit the scope of this invention in practice.

What is claimed is:

1. A conductive terminal, which is positioned in an insulative housing to be electrically connected to an electronic component and a circuit board, the insulative housing being formed with a first face and a second face which are opposite to each other, and having a plurality of terminal receiving cavities extending through the first face and the second face, each conductive terminal including a base for abutting against the corresponding terminal receiving cavity to achieve positioning, characterized in that:

the base has two adjacent sidewalls that form an angle therebetween, a resilient arm extending from one edge of one of the sidewalls which is in a direction of extension of the terminal receiving cavity, the resilient arm being bent back to approach the other edge of the corresponding sidewall and to form a non-closed ring shape with the corresponding sidewall such that the resilient arm is formed with a first contact portion and a second contact portion, respectively, at two opposite ends that are farthest away from the corresponding sidewall in the direction of extension of the terminal receiving cavity;

the first contact portion projecting from a plane in which the first face of the insulative housing lies, the second contact portion projecting from a plane in which the second face of the insulative housing lies, the first contact portion and the second contact portion electrically contacting the electronic component and the circuit board, respectively.

2. The conductive terminal as recited in claim 1, wherein the resilient arm has a bent section projecting outwardly of the first face from the edge of one of the sidewalls of the base proximate to the first face of the insulative housing and being bent in a substantially inverted U-shape, a connecting section connected to the other end of the bent section and passing through the terminal receiving cavity to extend in the direction of the second face, and a curved section that is connected to the other end of the connecting section, and that projects outwardly of and that is bent toward the second face such that the first contact portion is located on the bent section and the second contact portion is located on the curved section.

3. The conductive terminal as recited in claim 2, wherein the bent section is generally planar.

4. The conductive terminal as recited in claim 2, wherein the base is formed with a first sidewall, a second sidewall, and a third sidewall that are adjacent and that form angles thereamong, the first sidewall and the third sidewall being opposite to each other in a spaced-apart relationship, the bent section of the resilient arm extending from the third sidewall, the connecting section passing between the first sidewall and the third sidewall.

5. The conductive terminal as recited in claim 1, wherein the resilient arm has a bent section projecting from the edge of one of the sidewalls of the base proximate to the second face of the insulative housing and outwardly of the second face, and being bent in a substantially U-shape, a connecting section connected to the other end of the bent section and passing through the terminal receiving cavity to extend in the direction of the first face of the insulative housing, and a curved section that is connected to the other end of the connecting section, and that projects outwardly of and that is bent toward the first face such that the first contact portion is located on the curved section and the second contact portion is located on the bent section.

6. The conductive terminal as recited in claim 5, wherein the bent section is generally planar.

7. The conductive terminal as recited in claim 5, wherein the base is formed with a first sidewall, a second sidewall, and a third sidewall that are adjacent and that form angles thereamong, the first sidewall and the third sidewall being opposite to each other in a spaced-apart relationship, the bent section of the resilient arm extending from the first sidewall, the connecting section passing between the first sidewall and the third sidewall.

8. The conductive terminal as recited in claim 1, wherein the resilient arm has a first curved section projecting from the edge of one of the sidewalls of the base proximate to the first face of the insulative housing to be disposed outwardly of and to be bent toward the first face, a connecting section connected to the other end of the first curved section and passing through the terminal receiving cavity to extend in the direction of the second face of the insulative housing, and a second curved section that is connected to the other end of the connecting section, and that projects outwardly of and that is bent toward the second face such that the first contact portion is located on the first curved section and the second contact portion is located on the second curved portion.

9. The conductive terminal as recited in claim 8, wherein the base is formed with a first sidewall, a second sidewall, and a third sidewall that are adjacent and that form angles thereamong, the first sidewall and the third sidewall being opposite to each other in a spaced-apart relationship, the first curved section of the resilient arm extending from the first sidewall, the connecting section passing between the first sidewall and the third sidewall.

10. An electrical connector adapted to provide electrical connection between an electronic component and a circuit board, the electrical connector comprising:

an insulative housing formed with a first face and a second face opposite to each other, and having a plurality of terminal receiving cavities extending through the first face and the second face such that each of the terminal receiving cavities is defined by a corresponding inner wall surface; and a plurality of conductive terminals, each of the conductive terminals including a base that abuts against the inner wall surface of the corresponding terminal receiving cavity to achieve positioning, and a resilient arm connected to the base, the base having two adjacent side walls forming an angle therebetween, the resilient arm extending from one edge of one of the sidewalls in a direction of extension of the terminal receiving cavity, and being bent to pass through the terminal receiving cavity to approach the other edge of the corresponding sidewall so as to form a non-closed ring-shape, the resilient arm having portions projecting outwardly of the first face and the second face such that the portion of the resilient arm which projects outwardly of a plane in which the first face lies forms a first contact portion, and the portion of the resilient arm which projects outwardly of a plane in which the second face lies forms a second contact portion;

by virtue of the electrical contact of the first contact portion and the second portion with the electronic component and the circuit board, respectively, the electronic component can be electrically connected to the circuit board through the conductive terminals of the electrical connector.

11. The electrical connector as recited in claim 10, wherein the resilient arm of the conductive terminal has a bent section projecting outwardly of the first face from the edge of one of the sidewalls of the base proximate to the first face of the insulative housing and being bent in a substantially inverted U-shape, a connecting section connected to the other end of the bent section and passing through the terminal receiving cavity to extend in the direction of the second face, and a curved section that is connected to the other end of the connecting section, and that projects outwardly of and that is bent toward the second face such that the first contact portion is located on the bent section and the second contact portion is located on the curved section.

12. The electrical connector as recited in claim 12, wherein the bent section is generally planar.

13. The electrical connector as recited in claim 11, wherein the base of the conductive terminal is formed with a first sidewall, a second sidewall, and a third sidewall that are adjacent and that form angles thereamong, the first sidewall and the third sidewall being opposite to each other in a spaced-apart relationship, the bent section of the resilient arm extending from the third sidewall, the connecting section passing between the first sidewall and the third sidewall.

14. The electrical connector as recited in claim 10, wherein the resilient arm of the conductive terminal has a bent section projecting from the edge of one of the sidewalls of the base proximate to the second face of the insulative housing and outwardly of the second face, and being bent in a substantially U-shape, a connecting section connected to the other end of the bent section and passing through the terminal receiving cavity to extend in the direction of the first face of the insulative housing, and a curved section that is connected to the other end of the connecting section, and that projects outwardly of and that is bent toward the first face such that the first contact portion is located on the curved section and the second contact portion is located on the bent section.

15. The electrical connector as recited in claim 14, wherein the bent section is generally planar.

16. The electrical connector as recited in claim 14, wherein the base is formed with a first sidewall, a second sidewall, and a third sidewall that are adjacent and that form angles thereamong, the first sidewall and the third sidewall being opposite to each other in a spaced-apart relationship, the bent section of the resilient arm extending from the first sidewall, the connecting section passing between the first sidewall and the third sidewall.

17. The electrical connector as recited in claim 10, wherein the resilient arm of the conductive terminal has a first curved section projecting from the edge of one of the sidewalls of the base proximate to the first face of the insulative housing to be disposed outwardly of and to be bent toward the first face, a connecting section connected to the other end of the first curved section and passing through the terminal receiving cavity to extend in the direction of the second face of the insulative housing, and a second curved section that is connected to the other end of the connecting section, and that projects outwardly of and that is bent toward the second face such that the first contact portion is located on the first curved section and the second contact portion is located on the second curved portion.

18. The electrical connector as recited in claim 17, wherein the base of the conductive terminal is formed with a first sidewall, a second sidewall, and a third sidewall that are adjacent and that form angles thereamong, the first sidewall and the third sidewall being opposite to each other in a spaced-apart relationship, the first curved section of the resilient arm extending from the first sidewall, the connecting section passing between the first sidewall and the third sidewall.

\* \* \* \* \*